US005590214A

United States Patent [19]

Nakamura

[11] Patent Number: 5,590,214

[45] Date of Patent: Dec. 31, 1996

[54] VERTICAL ARRAY TYPE SPEAKER SYSTEM

[76] Inventor: Hisatsugu Nakamura, 13-3-1001 Roppongi 5-Chome, Minato-ku Tokyo, Japan

[21] Appl. No.: 326,878

[22] Filed: Oct. 21, 1994

[30] Foreign Application Priority Data

Nov. 12, 1993 [JP] Japan .................................... 5-307445

[51] Int. Cl.$^6$ .............................. H04R 25/00; H05K 5/00

[52] U.S. Cl. ............................ 381/182; 381/188; 381/89; 381/90; 181/144; 181/147

[58] Field of Search .................................... 381/188, 205, 381/88, 89, 90, 182, 156, 87; 181/144, 145, 147, 152, 155, 199

[56] References Cited

U.S. PATENT DOCUMENTS 4,733,749 3/1988 Newman et al. ....................... 181/144

4,969,196 11/1990 Nakamura .

OTHER PUBLICATIONS

Article "Column Speakers" by Victor Brociner, *Audio*, Aug. 1969, pp. 31, 32 and 34.

*Primary Examiner*—Sinh Tran
*Attorney, Agent, or Firm*—James G. O'Neill

[57] ABSTRACT

The efficiency of a vertical array speaker device is raised to obtain an adequate level of sound and to confine the horizontal radiation of the listening area of a surround sound system. A pair of baffle boards are mounted to a vertical array (4) with small diameter speakers (3), in symmetrical opposition, the boards are attached together at their rear edges (1*a*, 1*b*,) while the front edges are held open a predetermined width.

20 Claims, 4 Drawing Sheets

VERTICAL ARRAY TYPE SPEAKER SYSTEM

BACKGROUND OF THE INVENTION

1. Field of The Invention

This invention relates generally to speaker systems, and more particularly, to improved vertical array-type speaker systems.

2. Description of Related Art

In recent years various surround-sound speaker systems have come to be used for 3-dimensional reproduction of digitally recorded or broadcasted sound, (encoded with spatial data.) Clear natural surround-sound reproduction can only be obtained when the reproduced sound field is free from the effects of unwanted coloration, spurious lobal radiation, and unwanted, ceiling, floor and wall reflections.

The salient inherent features of arrayed column speakers have been exploited and improved in U.S. Pat. No. 4,553,628 and U.S. Pat. No. 4,969,196, however the low-efficiency of the direct radiating small diameter speaker units; in a single row array, led to experimentation with a double row. And subsequently resulted in the greatly improved, compact and highly efficient front-loaded vertically arrayed speaker system as described and claimed herein.

The speaker-device disclosed in U.S. Pat. No. 4,969,196 features the forming of a speaker and horn array in a baffle case. The positioning of the small diameter speakers as a closely spaced vertical array, provides a radiation pattern that is broad in the horizontal plane, whereas the pattern becomes sharp in the vertical plane, as the wave-length becomes shorter than the vertical length of the array. Mounting the direct-front-radiating speaker and backloading horn arrays in a back enclosing baffle-case permits easy stacking and serves to direct the back-side sound radiation of the arrays in a forward direction; in phase with the direct front radiation.

U.S. Pat. No. 4,969,196 teaches side-by-side placement of the speaker device to obtain a double row of arrayed-speakers. The problem of "horizontal confinement of the radiated sound", led to experiments with "directional front baffling." Experimentation led to a baffle-angle of 90 degrees, then to much smaller angles. A tremendous gain in efficiency as compression-driver action took-over was proved, and further research into multiple-arrayed boards, and directional-baffling boards resulted in the front loaded vertical array speaker concept which is claimed and described in this application.

The problem of low efficiency inherent with the single-row array has now been completely solved, and a compact low cost module construction allowing mounting in speaker-cabinets and other furniture; as well as in walls has been developed.

SUMMARY OF THE INVENTION

It is, therefore, an object of the present invention to provide an improved speaker system. It is a more particular object of the present invention to confine and enhance the operation of a vertical array type speaker system. It is a still more particular object of the present invention to provide a speaker system which eliminates spurious radiation lobes, out-of-phase wave-fronts, and rear-directed or side-directed sound radiation from the system.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

DESCRIPTION OF THE PREFERRED EMBODIMENTS

Figure 1:
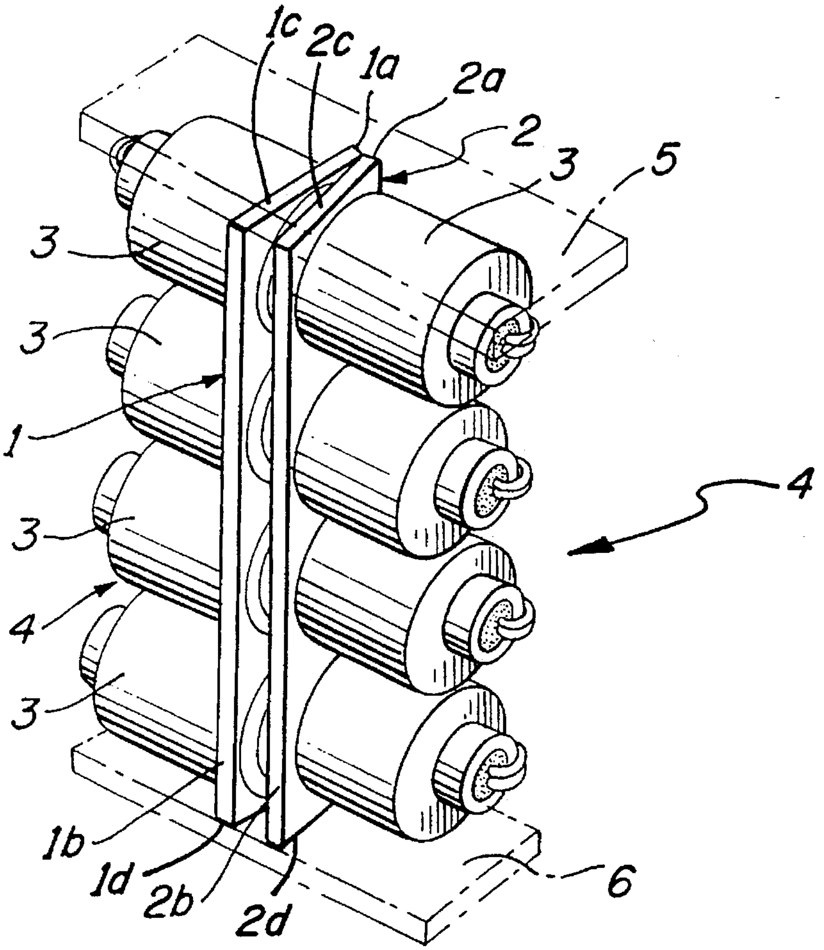
FIG. 1 is a diagonal view of an embodiment (No. 1) of this invention.

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to describe an improved "vertical array type speaker system".

The invention provides means to confine and enhance the flat horizontal radiation pattern of the "vertical array type speaker", to the listening area and listening height of a surround-sound multiple speaker system. With the ultimate object of, eliminating spurious radiation lobes, out-of-phase wave-fronts, and rear-directed or side-directed sound radiation from the speakers.

Complete elimination of damaging wall reflections can be obtained by placement of the speakers at listening height in the four wall corners of the listening area. Enhancement of the sound-image can be obtained by auxiliary center speakers built-in or placed close to the walls. The small size and flatness of the speaker-system provides a simple answer to installation problems.

As described in the prior art, the low efficiency of the single row small-diameter direct-radiating speaker array was overcome by double rows. However, the efficiency was low when compared with compression driver powered horn type speakers. Adopting compression amplification to multiple arrays has not only solved the efficiency problem, but also has solved many problems inherent in conventional compression-driver/horn speakers.

The seeps taken to arrive at the present invention comprise: arranging a pair of baffle boards on which are mounted a vertical array of small diameter speakers. The speakers are of the same diameter and with matched characteristics. They are positioned on each baffle board, symmetrically opposed; face-to-face. The rear-edges of the board are held together by hinges and sealed air-tight. While, the front edge of each baffle-board is held apart, to form a narrow vertical rectangular opening. The width of this opening is predetermined in relation to the diameter of the arrayed speakers. Top and bottom boards are fixed to the baffle-boards to form a "V"

shaped compression chamber when viewed from the top in cross-section.

Another pair of longer baffle boards are attached and sealed to the front edges of the first pair of baffle boards, as an extension; for confining and directing the sound radiation from the "V" shaped compression chamber.

Another concept for raising efficiency includes using the same size speakers which are arranged in vertical arrays mounted parallel to each other on symmetrically opposed baffle boards. Each pair of face-to-face arrays are driven by a common voice current to move forward in-phase. Delay circuits are introduced between each pair of arrays to compensate for the time required for a wave front to reach each array, starting from the innermost pair.

An alternative form is shown where, the diameter of the small speaker units are made smaller as the arrays recede to those mounted on the initial pair of baffle boards. This arrangement raises efficiency by employing small diameter units (with a higher cut-off frequency) in the initial compression stage. A cross-over LC circuit, provides sufficient delay to the voice current, driving the subsequent larger diameter paired array or arrays, but if not, a suitable delay or delays can be introduced.

Actual listening tests have proved that when a separate sub-woofer speaker with a high frequency cut-off of 150 Hz. (12 dB/octave) is employed in conjunction with the front-loaded vertical array speaker device claimed and described in this application, infinite baffle cases (as in compression driver units) can be adopted for the speaker-units, and, in particular, for the small diameter high-frequency speakers.

The construction of the present invention allows the basic speaker module to be housed in a small shallow baffle-case, roughly equivalent to the cabinet size of a single 7-inch diameter direct-radiator speaker. The compact size enables mounting in corner cabinets and walls, at ear-height to produce an ideal surround-sound field with excellent sound image definition, free from spurious radiation lobes, and interference from unwanted wall reflections.

The basic speaker module provides a highly efficient high intelligibility natural sounding speaker system for studio monitoring; as single modules. By stacking the modules and by side-by-side placement, of the extended arrays, sound distribution and reinforcement systems can now be designed in a predictable basis (2-D field instead of a 3-D sound field). And, the sound power required to cover a large area will be cut by 1/100th, with a 100% or more rise in intelligibility (Order out of chaos).

Figure 2:
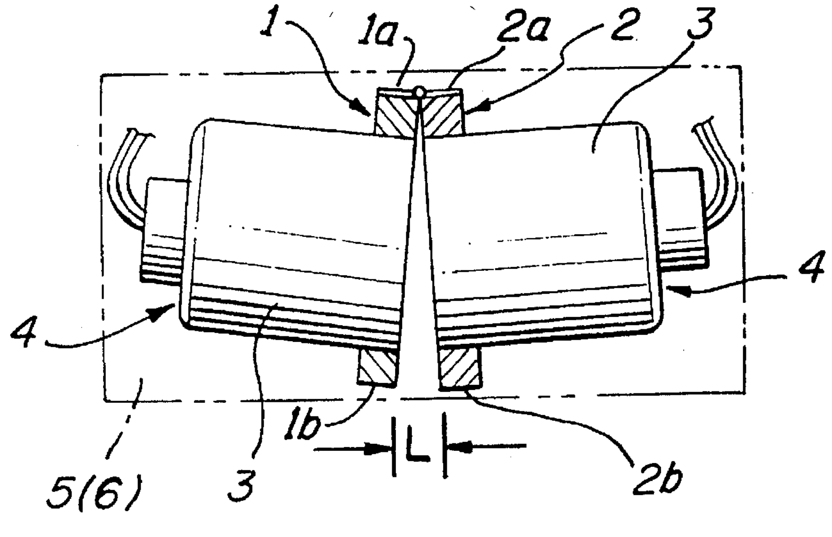
FIG. 2 is a sectional view of embodiment No. 1.

Turning now to the drawings, a basic or first embodiment (No. 1) is shown in FIG. 1 and FIG. 2. A pair of baffle boards 1 and 2 with their rear edges 1*a* and 2*a*, attached together, and their front edges 1*b* and 2*b*, held apart to subtend a predetermined angle, each have mounted vertical arrays 4, of small diameter speakers 3, positioned in symmetry to face each other.

Figure 3:
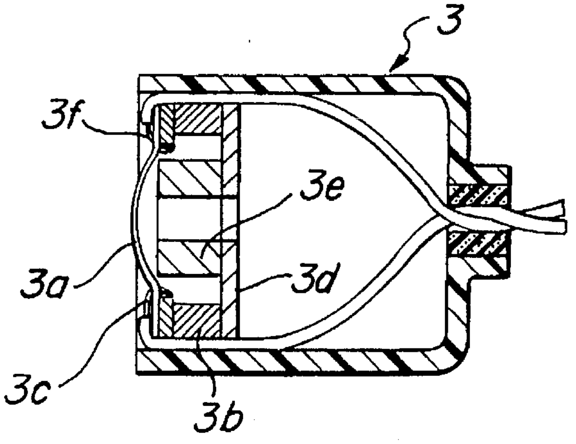
FIG. 3 is a sectional view of the small speaker unit used in embodiment No. 1.

Each small speaker unit 3, is preferably a moving-coil device of conventional construction (such as used and mass-produced for ear-phones), as shown in FIG. 3. 3*a* is a front radiating diaphragm, 3*b* is a cylindrical permanent magnet, with pole piece 3*c*, back-plate 3*d*, center pole-piece 3*e* and moving-coil 3*f*.

The effective diameter of the diaphragm 3*a*, of speaker-unit 3, is preferably less than 1.75 cm (one wavelength of a 20 kHz signal). If the effective diameter of diaphragm 3*a* becomes larger than 3.5 cm, which is twice the wavelength of a 20 kHz signal, interference between the arrayed speakers will result in large peaks and valleys in the radiated sound from array 4.

The effective distance between the effective diameter of adjacent speakers should, therefore, be less than 1.75 cm (the smaller the diameter the higher the cut-off frequency—this rule also applies in relation to path lengths leading to the opening at the front edge of the baffle boards 1 and 2). When the distance exceeds this value, interference will occur starting at 15 kHz or higher and cause lowering of the cut-off frequency.

A top board 5 is air-tightly fixed to top edges 1*c* and 2*c* of baffle boards 1 and 2, and bottom board 6, is fixed in the same manner to the bottom edges 1*d* and 2*b* of baffle boards 1, and 2. The width of an opening "L", formed at the front, may be made adjustable by employing suitable air-tight packing and hinging of the rear edges.

As shown in FIG. 2, as the width of the front-opening "L" is narrowed, the compression in the "V" shaped chamber formed between the 2 side arrays 4 is raised, thereby raising the sound pressure and conversion efficiency of the device. Conventional compression drivers have a ratio of roughly 20:1 for a 25 mm throat and 75 mm diaphragm. A gain of 4:1 has been found to be practical and free from disadvantages of the high compression driver-units: as a result of the in-phase radiation from the many vertical-arrayed small speaker units.

When "L" is selected to ½ the wavelength of the highest frequency to be reproduced, a good compromise is reached.

A horizontally spread, ear-height surround-sound field confined to the listening area can be achieved by placing and adjusting the vertically arrayed front loaded speaker device at the 4-corners of the listening area diagonally opposed and adjusted to recreate the surround-sound image as broadcast or recorded, with encoded 3-D information.

The key to near perfect imaging and natural sound lies in the recreation of the surround-sound field: 1) free from damaging wall, floor and ceiling reflections. 2) free from interference; such as phase-shifts between driver-units in 2–3 way systems, between large size (over 2") driver-units in arrayed speaker systems. 3) Free from coloration; such as horn-resonances and damaging lobes in horn-arrays, direct radiator cones, and cabinet resonances. Unnoticed coloration in full-range single way speaker systems utilizing back and side-wall reflections, appears to be the cause for confusing surround-sound speaker placement.

In short, the surround-sound field produced by the ear-height diagonally placed, in-phase driven vertical-arrays is confined to the listening area, whereas in conventional surround-sound systems wall reflections are purposely utilized to spread and diffuse the sound radiation from experimentally placed direct-radiating bass-reflexed speakers.

High power systems are required for producing the reflected sound field which is spread and diffused to produce the most impressive "thundering" sound for the occasion. Conventional surround sound systems, produce a high level of reverberant "colored sound" with a low level of "intelligibility". Whereas the correct surround sound system will produce a high level of "intelligibility" at a low level of sound from each speaker. For example, a 4-corner installation of the present invention should require less than 1/10 the power required for a conventional surround-sound system.

Figure 4:
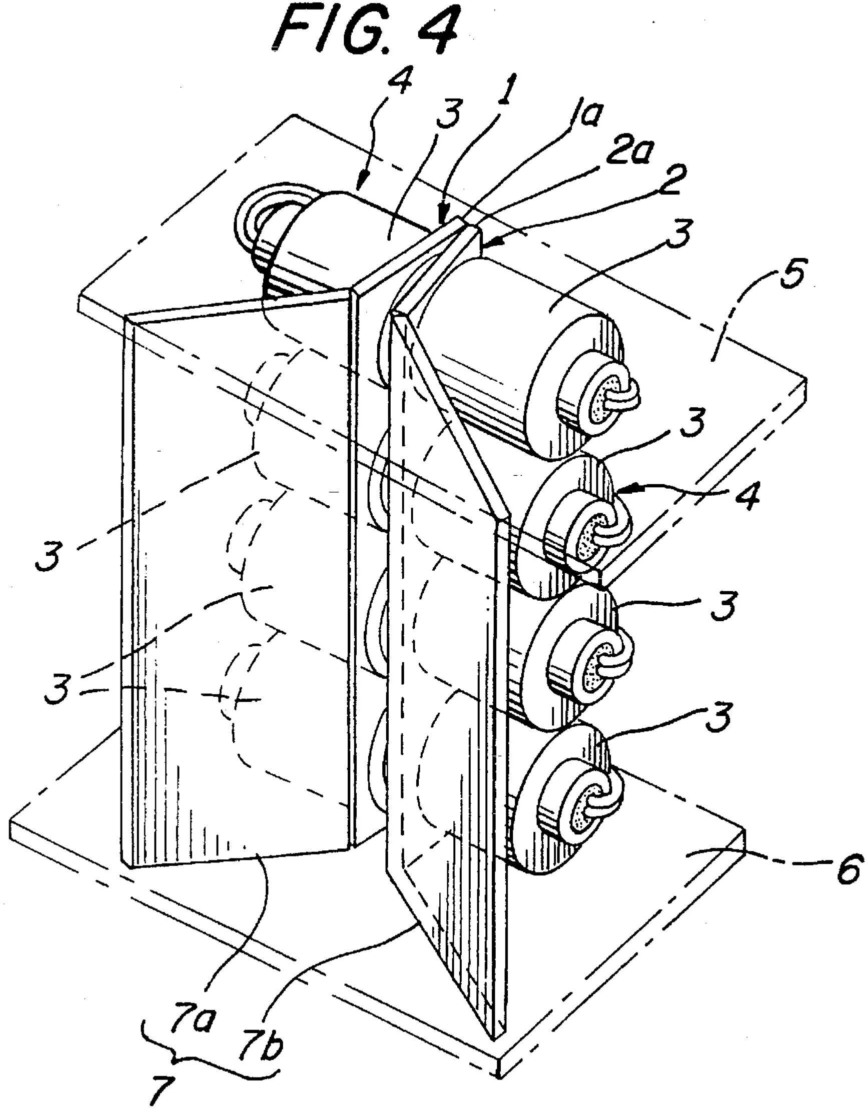
FIG. 4 is a diagonal view of another embodiment (No. 2)
Figure 5:
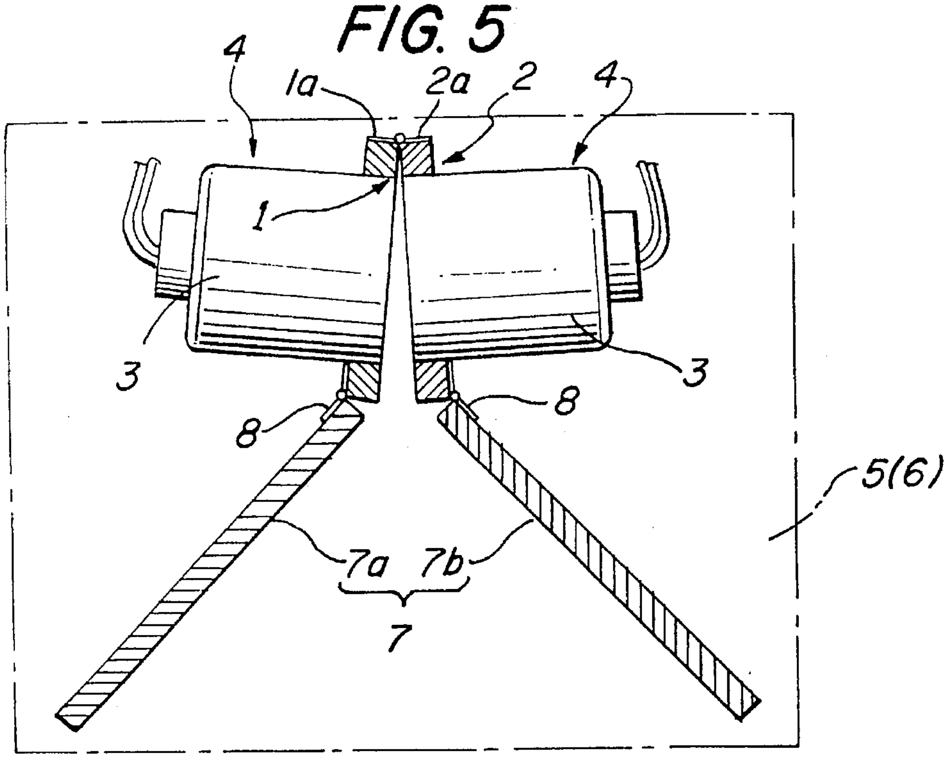
FIG. 5 is a sectional view of embodiment No. 2.

FIG. 4 and FIG. 5 illustrate another embodiment (No. 2) of the basic concept of the invention. This embodiment provides horizontal directivity to the sound radiated from the narrow slot-like mouth of baffle boards 1, and 2, of FIG. 1 and 2. In this embodiment, extension baffle-boards 7*a* and 7*b*, are attached to the front edges 1*b* and 2*b* of baffle boards 1 and 2, by hinges 8*a* and 8*b*.

Top board 5 and bottom board 6, to which the extension baffle-boards 7*a* and 7*b* are attached, are secure to them air-tightly with packing. The same air-tight packing is applied to the hinged joint with baffle-boards 1 and 2.

The extension baffle-boards 7*a* and 7*b*, with top and bottom boards 5 and 6 secured thereto, serve as a directional baffle-horn which not only confines the horizontal radiation pattern, but also amplifies the sound emitted from the narrow slot-like mouth of baffle boards 1 and 2.

Figure 6:
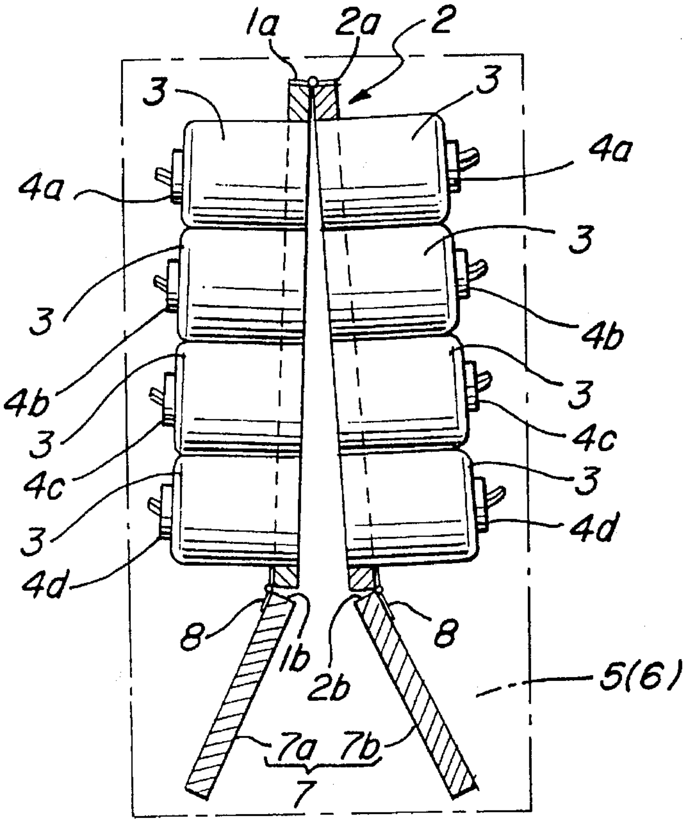
FIG. 6 is a sectional view of a further embodiment (No. 3)

FIG. 6 illustrates yet another embodiment (No. 3) of the present invention. The symmetrically opposed baffle boards and objective of increasing the sound intensity by face-to-face compression is the same, as the embodiment illustrated in FIG. 4 and FIG. 5. However, in this case two vertical arrays of 4 of the same sized speakers 4*a*, 4*b*, 4*c*, 4*d*, are electrically connected in paired arrays and mounted on boards 1 and 2, which are air-tightly attached at the rear-edges 1*a* and 1*b* by a hinge.

Each opposed pair of arrays 4*a*, 4*b*, 4*c*, 4*d* is driven to compress the outgoing wave by individual power amplifiers. Suitable delays are introduced in the inputs to each stage to compensate for the phase-lag between the paired arrays (application of the traveling-wave concept).

A controlled vertical in-phase wave-front of high intensity unobtainable through conventional horn loading has been realized.

Freedom from horn resonances (horn coloration) and air-compression distortion inherent in the case of horn loaded compression-driver powered horn speakers is another feature.

Figure 7:
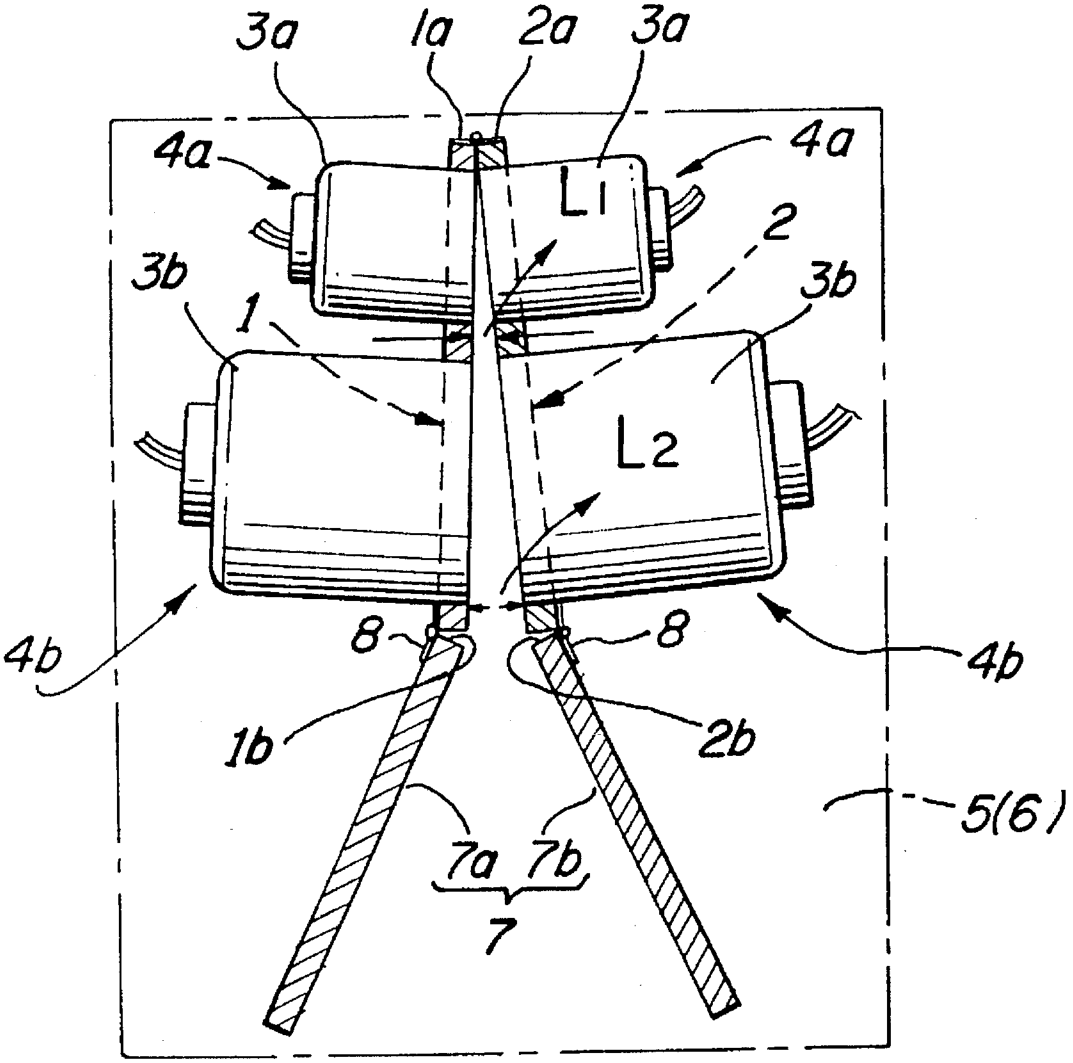
FIG. 7 is a sectional view of a further embodiment (No. 4).

Yet another embodiment (No. 4) of the present invention is illustrated in FIG. 7. This embodiment No. 4 is a modification of embodiment No. 3 illustrated in FIG. 6. In this embodiment No. 4, the diameter of the arrayed small-speakers 3*a* and 3*a*, symmetrically opposed face-to-face, are made smaller as the paired arrays recede towards the rear-most edges 1*a* and 2*a* of baffle boards 1 and 2.

For example, speaker array 4*a*, 4*a*, positioned close to edges 1*a* and 2*a*, comprise speakers 3*a*, 3*a* with a diameter of 20 mm. And, speaker array 4*b*, 4*b*, positioned close to front opening L, comprise speakers 3*b*, 3*b* with a diameter of 40 mm. Opening L1 in this case was made 5 mm, whereas opening L2 was made 15 mm. A low-pass filter or delay, is introduced between paired arrays 4*a* and 4*b* to maintain in-phase wave-front formation.

Embodiment No. 4 illustrated in FIG. 7 illustrates a case when only 2 rows of opposed arrays comprised of 2 different diameter speakers are mounted face-to face. However, the concept is not limited to 2-rows and 2-diameter sizes and 2-opening widths, but envisages multiple rows, decreasing in speaker diameter as the rows approach the rear most sealed edges. An important relationship is to maintain opening widths always narrowing in relation to the diameter of the arrayed speakers. For example, 4–100 mm speakers, arrayed 2 per side, with a mouth opening of 50 mm; 6–50 mm speakers, arrayed 3 per side, with a mouth opening 25 mm wide; 8–39 mm speakers, arrayed 4 per side, with a mouth 18 mm wide; 10–25 mm diameter speakers, arrayed 5 per side, with a mouth opening of 5 mm. All the arrayed speakers should be driven only within the frequency-range where piston motion of the diaphragm can be assured, (by low-pass filters for each stage) and further delays per stage can be introduced for correct wave front build-up, free from horn and air-passage resonances.

In the preceding, embodiments No. 1 through 4 illustrate practical applications of the basic principles and concepts set forth in the claims of this invention. Extension of the vertical array, by stacking the device as claimed in U.S. Pat. No. 4,969,196, has been made possible by the construction of the device as set forth herein. Furthermore, housing the device in a baffle-case as described herein, and back-loading the arrayed low-frequency speakers, as claimed in the above US patent, makes reproduction of quality sound possible down to the sub-woofer range.

Housing the device in a baffle case of compact dimensions will permit mounting in the surrounding walls, or in corner cabinets, in a manner that will prevent damaging reflections and will enhance the surround-field forming feature of this speaker-system.

As explained above, experiments with baffling arrangements for raising the radiation efficiency of a twin row of arrayed speakers led to the principle disclosed in this application. Actual measurements and comparison tests for clarity and naturalness of sound reproduction were made in the largest cathedral in Tokyo, proving that a twin row of 8 speakers each, or a total of 16 speakers proved to be 6 dB higher in efficiency than a stacked array of two single-row speakers totaling 16 speakers. The increased radiation area and consequent front loading resulted in the 6 dB gain which was obtained without baffling. Subsequent tests with front baffling described herein produced a gain in efficiency of over 18 dB.

Experimentation with a prototype model of embodiment No. 4 has proved that the concept is practical and the sound radiated from the small size (25 mm) speaker diaphragms moving in opposition is obtained as a cylindrical wave front emitted from the 5 mm-wide slot-like opening with a frequency range of 20 kHz down to 150 Hz. Thus, the need for a separate high-frequency horn-type "tweeter" speaker and its drawbacks are eliminated.

As previously explained, the compact size, regardless of the high efficiency and excellent surround-sound characteristics, makes the speaker-device ideal for housing in a baffle case for preventing backward directed sound radiation. Furthermore, installing the encased speaker device in a corner cabinet, or shelf, etc., located at the four corners of the listening area at ear-height, is a requirement for fully exploiting the surround-sound producing characteristics of this novel speaker device.

What I claim is:

1. A vertical array type speaker system comprising:

a pair of adjustable symmetrically opposed baffle boards having front and rear edges;

an array of small diameter speakers mounted on each of said pair of adjustable symmetrically opposed baffle boards so as to be positioned face to face;

the rear edges of said pair of adjustable symmetrically opposed baffle boards being sealingly held together, whereas the front edges of said pair of adjustable symmetrically opposed baffle boards are held apart by top and bottom boards to form a V-shaped chamber having a narrow slot-like opening with a predetermined width.

2. The vertical array type speaker system of claim 1 wherein each of said pair of adjustable symmetrically opposed baffle boards is made adjustable with respect to the other.

3. The vertical array type speaker system of claim 2, further including a holding means for mounting said vertical array type speaker system for ear-height forward directed surround sound radiation.

4. The vertical array type speaker system of claim 1 wherein the narrow slot-like opening formed by the front edges of said pair of adjustable symmetrically opposed baffle boards is expanded horizontally by further baffle boards.

5. The vertical array type speaker system of claim 4 wherein each of said pair of adjustable symmetrically opposed baffle boards is made adjustable with respect to the other.

6. The vertical array type speaker system of claim 5, further including a holding means for mounting said vertical array type speaker system for ear-height forward directed surround sound radiation.

7. The vertical array type speaker system of claim 4 wherein the paired arrays of face-to-face small diameter speakers are being driven by a common voice-current to move in phase; and delay circuits are connected between said paired arrays of face-to-face small diameter speakers to maintain a common wave-front.

8. The vertical array type speaker system of claim 7 wherein each of said pair of adjustable symmetrically opposed baffle boards is made adjustable.

9. The vertical array type speaker system of claim 8, further including a holding means for mounting said vertical array type speaker system for ear-height forward directed surround sound radiation.

10. The vertical array type speaker system of claim 1 wherein the paired arrays of face-to-face small diameter speakers are driven by a common voice-current to move in phase; and delay circuits are connected between said paired arrays of face-to-face small diameter speakers to maintain a common wave-front.

11. The vertical array type speaker system of claim 10 wherein each of the paired arrays of face-to-face small diameter speakers is equal in diameter, with the face-to-face small diameter speakers being reduced in diameter as they recede from the narrow slot-like opening formed between said front edges of said pair of adjustable symmetrically opposed baffle boards toward the sealed together rear edges thereof, and the width of the opening between said pair of symmetrically opposed baffle boards being determined by the number of paired arrays of face-to-face small diameter speakers, and the respective diameters of the face-to-face small diameter speakers mounted thereon.

12. The vertical array type speaker system of claim 11 wherein adjustable of said pair of adjustable symmetrically opposed baffle boards is made adjustable with respect to the other.

13. The vertical array type speaker system of claim 12, further including a means for mounting said vertical array type speaker system for forward directed surround sound radiation.

14. The vertical array type speaker system of claim 1 wherein each of the paired arrays of face-to-face small diameter speakers is equal in diameter, with the face-to-face small diameter speakers being reduced in diameter as they recede from the narrow slot-like opening formed between said front edges of said pair of adjustable symmetrically opposed baffle boards toward the sealed together rear edges thereof, and the width of the opening between said pair of symmetrically opposed baffle boards being determined by the number of paired arrays of face-to-face small diameter speakers, and the respective diameters of the face-to-face small diameter speakers mounted thereon.

15. The vertical array type speaker system of claim 14 wherein each of said pair of adjustable symmetrically opposed baffle boards is made adjustable with respect to the other.

16. The vertical array type speaker system of claim 15, further including a holding means for mounting said vertical array type speaker system for ear-height forward directed surround sound radiation.

17. A vertical array type speaker system comprising, in combination:

a means for mounting said vertical array type speaker system for forward directed surround sound radiation;

a pair of adjustable symmetrically opposed baffle boards having rear edges and front edges;

a plurality of arrays of small diameter speakers positioned face-to-face on each of said pair of adjustable symmetrically opposed boards; said plurality of arrays of small diameter speakers being arranged face-to-face in mirror symmetry;

a common voice-current means connected to said plurality of arrays of small diameter speakers to move them in phase;

delay means connected between said plurality of arrays of small diameter speakers to maintain a common wave-front; and the rear edges of said pair of adjustable symmetrically opposed baffle boards being sealingly held together by hinge means, with the front edges thereof held apart by top and bottom boards to form a narrow slot-like opening of predetermined width.

18. The vertical array type speaker system of claim 17 wherein the narrow slot-like opening formed by the front edges of said pair of adjustable symmetrically opposed baffle boards is expanded horizontally by a further pair of baffle boards.

19. The vertical array type speaker system of claim 17 wherein each of the paired arrays of face-to-face small diameter speakers is equal in diameter, with the equal in diameter face-to-face small diameter speakers being reduced in diameter as they recede from the narrow slot-like opening formed between said front edges of said pair of adjustable symmetrically opposed baffle boards toward the sealingly held together rear edges thereof, and the width of the opening formed between said pair of symmetrically opposed baffle boards being determined by the number of paired arrays of face-to-face small diameter speakers, and the respective diameters of the face-to-face small diameter speakers mounted thereon.

20. A vertical array type speaker system comprising, in combination:

a means for mounting said vertical array type speaker system for forward directed surround sound radiation;

a pair of adjustable symmetrically opposed baffle boards having rear edges and front edges;

a plurality of arrays of small diameter speakers positioned face-to-face on each of said pair of adjustable symmetrically opposed boards; said plurality of arrays of small diameter speakers being arranged face-to-face in mirror symmetry;

a common voice-current connected to said plurality of arrays of small diameter speakers to move them in phase;

delay circuits connected between said plurality of arrays of small diameter speakers to maintain a common wave-front; and the rear edges of said pair of adjustable symmetrically opposed baffle boards being hingedly and sealingly held together, with the front edges thereof held apart by top and bottom boards to form a V-shaped compression chamber extending from said rear edges to a narrow slot-like opening of predetermined width, at said front edges.

* * * * *